United States Patent
Hsiao

(10) Patent No.: US 10,983,149 B2
(45) Date of Patent: Apr. 20, 2021

(54) INRUSH CURRENT TEST DEVICE

(71) Applicant: Chicony Power Technology Co., Ltd., New Taipei (TW)

(72) Inventor: Jen-Hao Hsiao, New Taipei (TW)

(73) Assignee: CHICONY POWER TECHNOLOGY CO., LTD., New Taipei (TW)

( * ) Notice: Subject to any disclaimer, the term of this patent is extended or adjusted under 35 U.S.C. 154(b) by 42 days.

(21) Appl. No.: 16/690,463

(22) Filed: Nov. 21, 2019

(65) Prior Publication Data

US 2021/0072292 A1 Mar. 11, 2021

(30) Foreign Application Priority Data

Sep. 6, 2019 (TW) ................................. 108132330

(51) Int. Cl.
| | |
|---|---|
| *G01R 31/26* | (2020.01) |
| *G01R 19/165* | (2006.01) |
| *G01R 1/28* | (2006.01) |
| *G01R 1/36* | (2006.01) |

(52) U.S. Cl.
CPC ......... *G01R 19/16547* (2013.01); *G01R 1/28* (2013.01); *G01R 1/36* (2013.01)

(58) Field of Classification Search
CPC ..... G01N 29/075; G01P 3/565; G01R 23/005; G01R 31/26; G01R 31/2642; G01R 31/2648; G01R 31/2831; G01R 31/31702; G01S 1/30; G01S 1/306; G05B 1/00; H02H 3/302; H02H 3/353; H02H 3/382
See application file for complete search history.

(56) References Cited

U.S. PATENT DOCUMENTS

| 4,333,049 A * | 6/1982 | Yui .................... G01R 19/0092 324/102 |
| 4,868,505 A | 9/1989 | Stahl |
| 2003/0090271 A1* | 5/2003 | Hurwicz ............ G01R 31/3272 324/424 |

(Continued)

FOREIGN PATENT DOCUMENTS

| CN | 101114769 A | 1/2008 |
| CN | 201332268 | 10/2009 |

(Continued)

*Primary Examiner* — Tung X Nguyen
(74) *Attorney, Agent, or Firm* — Innovation Capital Law Group, LLP; Vic Lin

(57) ABSTRACT

An inrush current test device is adapted to receive an alternating current. The inrush current test device includes: a first isolation coupling component, a positive crossing point pulse generation circuit, an output circuit, and a control circuit. The first isolation coupling component includes a primary side and a secondary side, and is responsive to the alternating current on the primary side and conducts the secondary side. When the secondary side transits from an off state to an on state, the positive crossing point pulse generation circuit generates a positive crossing point pulse. When the control circuit is actuated and the positive crossing point pulse is detected, after delaying for a delay time, the control circuit outputs a control pulse for actuating the output circuit for a first operating time. The output circuit is configured to receive the alternating current and output the alternating current when the output circuit is actuated.

18 Claims, 9 Drawing Sheets

(56) References Cited

U.S. PATENT DOCUMENTS

2011/0140732 A1\* 6/2011 Xie ................ G01R 31/40
　　　　　　　　　　　　　　　　324/764.01

FOREIGN PATENT DOCUMENTS

| CN | 103035443 A | 4/2013 |
| CN | 104198781 B | 9/2017 |
| TW | M332931 U | 5/2008 |
| TW | M409629 U | 8/2011 |
| TW | 201509050 A | 3/2015 |

\* cited by examiner

INRUSH CURRENT TEST DEVICE

CROSS-REFERENCE TO RELATED APPLICATION

This non-provisional application claims priority under 35 U.S.C. § 119(a) to Patent Application No. 108132330 filed in Taiwan, R.O.C. on Sep. 6, 2019, the entire contents of which are hereby incorporated by reference.

BACKGROUND

Technical Field

The present invention relates to the power supply field, and in particular, to an inrush current test device.

Related Art

An inrush current often occurs at the moment when an electronic device begins to input electricity. The inrush current is usually much greater than a steady-state current, and consequently components in the electronic device may be damaged due to the inability to withstand the inrush current. When the inrush current is greater, the components in the electronic device are more likely to be damaged.

The inrush current may occur due to, for example, the following reason: a primary side circuit of an AC power supply includes an energy storage capacitor, and the moment when the AC power supply delivers power, an AC input current rapidly charges the energy storage capacitor and generates an instantaneous inrush current.

In order to prevent the electronic device from being damaged by the inrush current, an existing electronic device needs to be provided with a protection circuit at an input end or use parts of appropriate specifications. However, different types of electronic devices need to have protection circuits of different specifications or separately use parts of different specifications. If the electronic device cannot be tested with a maximum peak inrush current or appropriate parts cannot be selected, a protection circuit of an insufficient specification may be manufactured.

A voltage supplied by mains varies under different mains conditions. For example, a common mains voltage includes a high voltage (220 volts) and a low voltage (110 volts). Because a rising slope or falling slope of an input sine wave of the high voltage and that of the low voltage are different, there may be errors in circuit parameters of the electronic device, and consequently the electronic device cannot be accurately applied according to the design concept.

For example, an electronic device used for mains phase detection needs to detect a phase by detecting a zero crossing point of a mains sine wave. However, when there is a difference in the rising slope or falling slope of the input sine wave of the mains voltage, a phase detection time may be delayed or advanced, and consequently a detection signal for the zero crossing point of the mains sine wave is not absolutely accurate. As a result, this causes great inconvenience to the daily use of the electronic device.

SUMMARY

In view of the above, the present invention provides an inrush current test device.

According to some embodiments, an inrush current test device is adapted to receive an alternating current. The inrush current test device includes: a first isolation coupling component, a positive crossing point pulse generation circuit, an output circuit, and a control circuit. The positive crossing point pulse generation circuit is coupled to the first isolation coupling component. The control circuit is coupled to the positive crossing point pulse generation circuit and the output circuit. The first isolation coupling component includes a primary side and a secondary side. The first isolation coupling element is responsive to a positive half-cycle potential of the alternating current on the primary side and conducts the secondary side. When the secondary side transits from an off state to an on state, the positive crossing point pulse generation circuit generates a positive crossing point pulse. When the control circuit is actuated and the positive crossing point pulse is detected, after delaying for a delay time, the control circuit outputs a control pulse for actuating the output circuit for a first operating time. The output circuit is configured to receive the alternating current and output the alternating current when the output circuit is actuated.

According to some embodiments, a high and low voltage compensation device is configured to correct an alternating current, and is adapted to operate in a high voltage mode and a low voltage mode. The high and low voltage compensation device includes: an isolated input circuit, a driving circuit, a correcting circuit, and an isolated output circuit. The isolated input circuit includes an input side and an actuation side. The driving circuit is coupled to the actuation side. The isolated output circuit is coupled between the driving circuit and the correcting circuit. The isolated input circuit is responsive to a positive half-cycle potential of the alternating current on the input side and conducts the actuation side. The driving circuit is configured to generate a driving signal. In the high voltage mode, when the actuation side is conducted, the driving signal is a low level signal. In the low voltage mode, when the actuation side is conducted, the driving signal is a high level signal. The correcting circuit is configured to correct the alternating current to generate a compensation power. The isolated output circuit is configured to selectively output the compensation power according to the driving signal.

According to some embodiments, an inrush current test device further includes a high and low voltage compensation device, where the high and low voltage compensation device is coupled to the first isolation coupling component, and is configured to output a compensation power. The first isolation coupling component is responsive to a positive half-cycle potential of the compensation power on the primary side and conducts the secondary side.

In conclusion, the inrush current test device in some embodiments of the present invention is adapted to receive an alternating current, generate a positive crossing point pulse according to a positive crossing point of the alternating current, and output a test power according to the positive crossing point pulse, where the test power is the alternating current in a reference phase. Therefore, the inrush current test device can provide an inrush current in an accurate phase to an electronic device for testing. According to some embodiments, the high and low voltage compensation device corrects the alternating current by operating in a high voltage mode and a low voltage mode, and outputs a compensation power with the same voltage rising slope by using the corrected alternating current. Therefore, the high and low voltage compensation device can ensure that the inrush current test device in the present invention uses the compensation power with the same voltage rising slope for phase calculation, whether the input alternating current is in the high voltage mode or the low voltage mode, so as to reduce the phase error.

DETAILED DESCRIPTION

In the present invention, the word "coupling" and its derivatives are used. In some embodiments, "coupling" may be used to indicate that two or more components are in direct physical or electrical contact with each other, or may also mean that two or more components are in indirect electrical contact with each other. The word "coupling" can still be used to indicate that two or more components collaborate or interact with each other.

Figure 1:
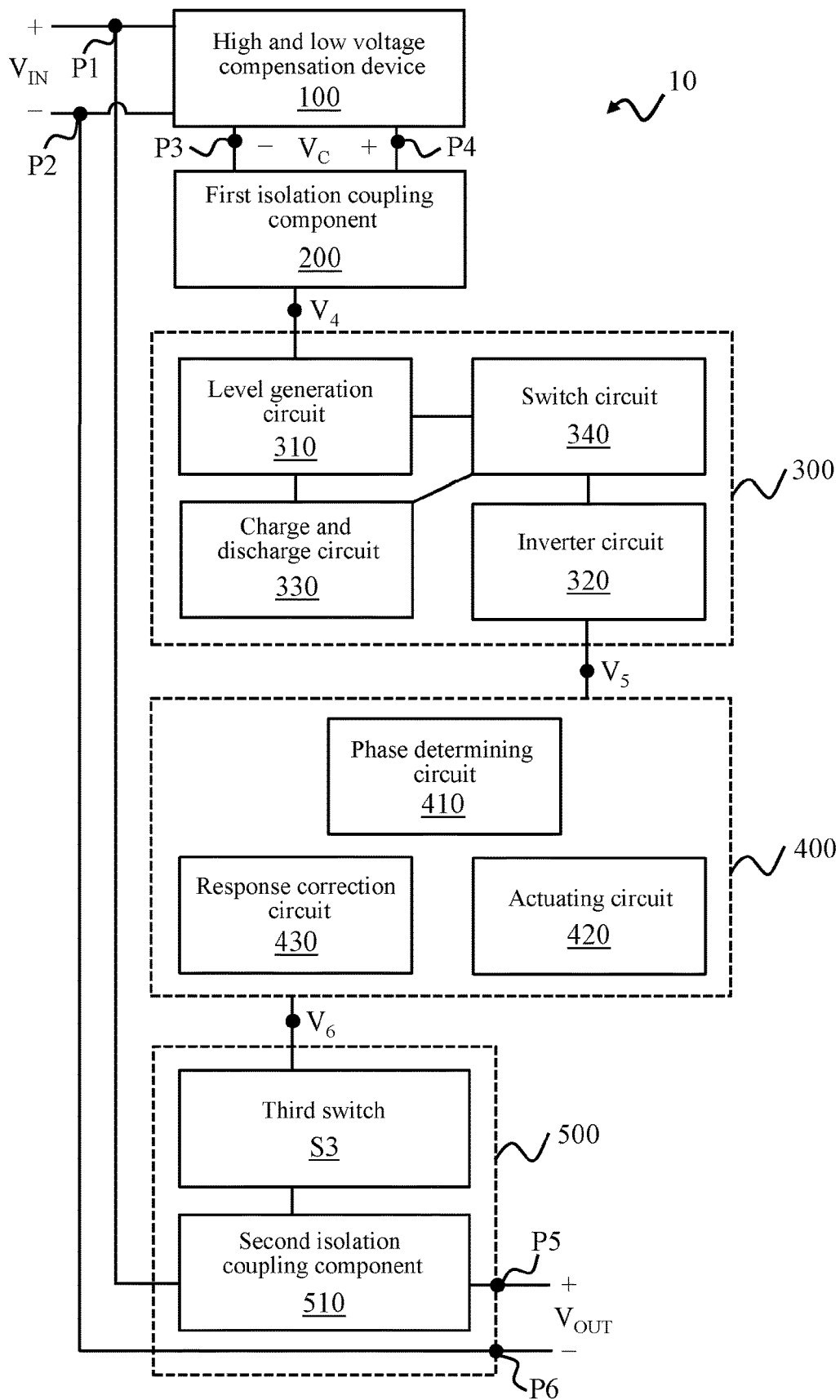
FIG. 1 is a block diagram of an inrush current test device according to some embodiments of the present invention.
Figure 2:
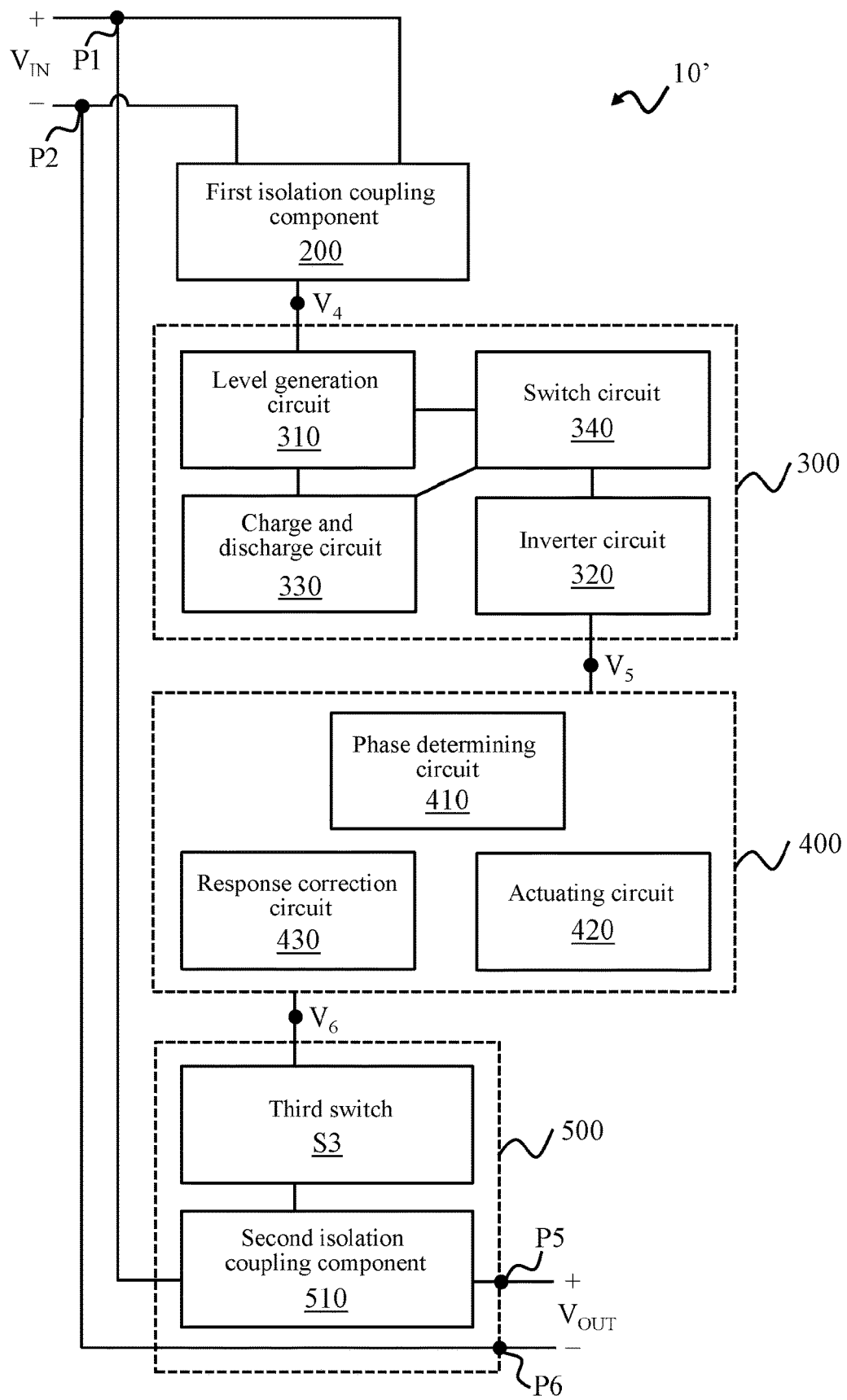
FIG. 2 is a block diagram of an inrush current test device according to some embodiments of the present invention.

FIG. 1 is a block diagram of an inrush current test device 10 according to some embodiments of the present invention, and FIG. 2 is a block diagram of an inrush current test device 10' according to some embodiments of the present invention. Referring to FIG. 1 and FIG. 2, in some embodiments, the inrush current test device 10 (10') is adapted to receive an alternating current $V_{IN}$, and output a test power $V_{OUT}$ according to the alternating current $V_{IN}$ in a reference phase. The reference phase is, for example but not limited to, 90 degrees, 270 degrees, or other phases. That is, the inrush current test device 10 (10') is configured to convert the received alternating current $V_{IN}$, and output the received alternating current $V_{IN}$ in the form of the test power $V_{OUT}$. The output test power $V_{OUT}$ is the alternating current $V_{IN}$ in the reference phase. In other words, the inrush current test device 10 (10') may be regarded as a device for detecting a phase of the alternating current $V_{IN}$ and outputting the alternating current $V_{IN}$ when the alternating current $V_{IN}$ is in the reference phase.

Referring to FIG. 1, in some embodiments, the inrush current test device 10 includes a high and low voltage compensation device 100, a first isolation coupling component 200, a positive crossing point pulse generation circuit 300, a control circuit 400, an output circuit 500, input ends P1, P2, compensation ends P3, P4, and output ends P5, P6. The high and low voltage compensation device 100 is coupled to the first isolation coupling component 200. The first isolation coupling component 200 is coupled to the positive crossing point pulse generation circuit 300. The positive crossing point pulse generation circuit 300 is coupled to the control circuit 400. The control circuit 400 is coupled to the output circuit 500. The high and low voltage compensation device 100 receives an alternating current $V_{IN}$ from the input ends P1, P2, and outputs a compensation power $V_C$ through the compensation ends P3, P4. The first isolation coupling component 200 receives the compensation power $V_C$ from the compensation ends P3, P4. The first isolation coupling component 200, the positive crossing point pulse generation circuit 300, and the control circuit 400 actuate the output circuit 500 according to the compensation power $V_C$. The output circuit 500 receives the alternating current $V_{IN}$ from the input ends P1, P2, and outputs the test power $V_{OUT}$ through the output ends P5, P6 when the output circuit 500 is actuated.

Figure 3:
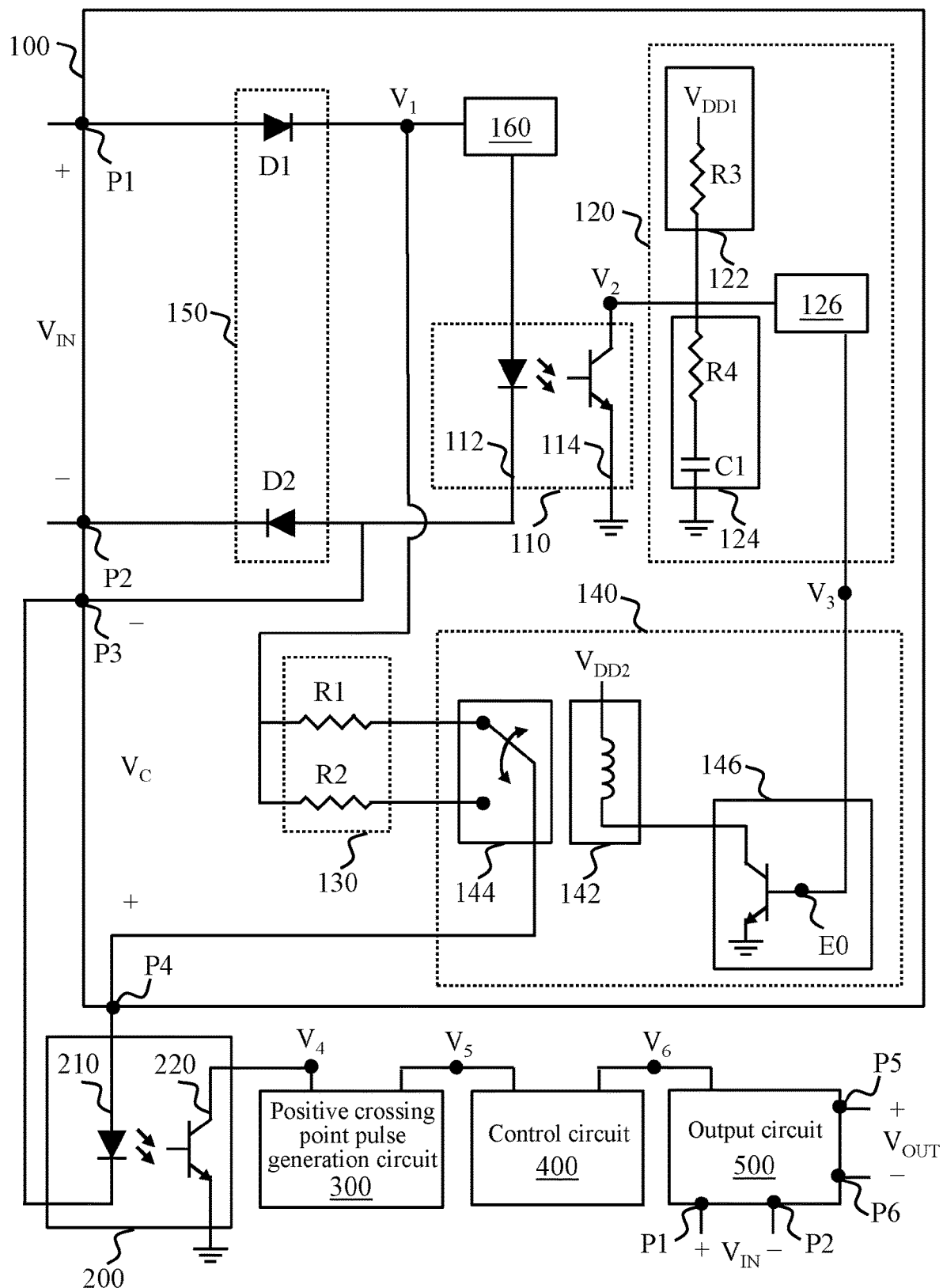
FIG. 3 is a circuit diagram of a high and low voltage compensation device according to FIG. 1.

FIG. 3 is a circuit diagram of a high and low voltage compensation device 100 according to FIG. 1. Referring to FIG. 3, in some embodiments, the high and low voltage compensation device 100 is configured to correct the alternating current $V_{IN}$ to output the compensation power $V_C$. The high and low voltage compensation device 100 is adapted to operate in a high voltage mode and a low voltage mode. The high and low voltage compensation device 100 includes an isolated input circuit 110, a driving circuit 120, a correcting circuit 130, an isolated output circuit 140, a rectifying circuit 150, and a current-limiting circuit 160. The isolated input circuit 110 is coupled to the driving circuit 120. The isolated output circuit 140 is coupled between the driving circuit 120 and the correcting circuit 130. The correcting circuit 130 is coupled to the isolated input circuit 110. The rectifying circuit 150 is coupled to the isolated input circuit 110 and the correcting circuit 130. According to some embodiments, when the alternating current $V_{IN}$ is 220 volts, the high and low voltage compensation device 100 operates in the high voltage mode, and when the alternating current $V_{IN}$ is 110 volts, the high and low voltage compensation device 100 operates in the low voltage mode.

In some embodiments, the rectifying circuit 150 includes a first asymmetric conducting component D1 and a second asymmetric conducting component D2. The first asymmetric conducting component D1 is coupled between the input end P1 and the isolated input circuit 110, and the second asymmetric conducting component D2 is coupled between the input end P2 and the isolated input circuit 110. The rectifying circuit 150 is configured to rectify the alternating current $V_{IN}$, to prevent the isolated input circuit 110 from being damaged by a reverse voltage (for example, the alternating current $V_{IN}$ at a negative half-cycle potential). Therefore, when the high and low voltage compensation device 100 receives the alternating current $V_{IN}$, a current direction along which the alternating current $V_{IN}$ acts on the high and low voltage compensation device 100 is limited by the rectifying circuit 150, that is, the current direction is as follows: the current flows in from the input end P1, then flows through the first asymmetric conducting component D1, the isolated input circuit 110, and the second asymmetric conducting component D2, and finally flows out via the input end P2. In other words, the rectifying circuit 150 is configured to rectify the alternating current $V_{IN}$ into a rectified alternating current $V_1$, and the rectified alternating current $V_1$ includes a positive half-cycle potential and a zero potential of the alternating current $V_{IN}$. Therefore, the rectifying circuit 150 can be used to protect the isolated input circuit 110, to ensure that the isolated input circuit 110 does not receive the negative half-cycle potential of the alternating current $V_{IN}$. According to some embodiments, the first asymmetric conducting component D1 and the second asymmetric conducting component D2 are diodes.

Figure 4:
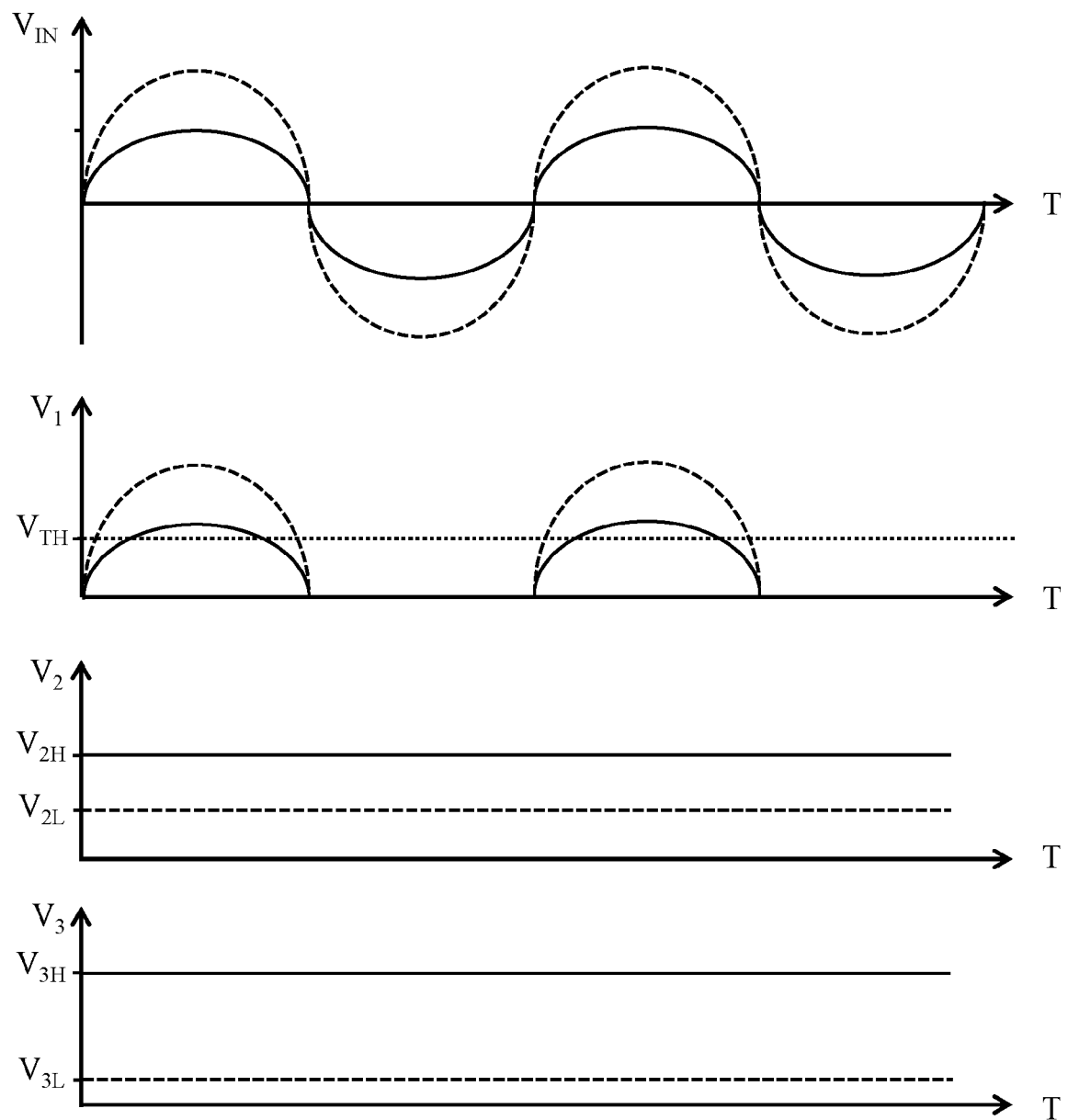
FIG. 4 is a signal diagram of the high and low voltage compensation device according to FIG. 3.

FIG. 4 is a signal diagram of the high and low voltage compensation device 100 according to FIG. 3. Referring to FIG. 3 and FIG. 4, in some embodiments, the isolated input circuit 110 includes an input side 112 and an actuation side 114. The input side 112 is configured to receive the rectified alternating current $V_1$, and cause the actuation side 114 to be conducted or disconnected according to the rectified alternating current $V_1$. Specifically, when the rectified alternating current $V_1$ is equal to the positive half-cycle potential of the alternating current $V_{IN}$ and is greater than a threshold voltage $V_{TH}$ of the input side 112, the input side 112 is responsive to the rectified alternating current $V_1$ to cause the actuation side 114 to be conducted. Conversely, when the rectified alternating current $V_1$ is equal to or less than the threshold voltage $V_{TH}$ of the input side 112, the isolated input circuit 110 disconnects the actuation side 114. According to some embodiments, the isolated input circuit 110 is, for example but not limited to, an isolated coupling component, or an optical coupling component.

In some embodiments, the current-limiting circuit 160 is coupled between the rectifying circuit 150 and the isolated input circuit 110. Specifically, the current-limiting circuit 160 is, for example but not limited to, coupled between the first asymmetric conducting component D1 and the input side 112 (as shown in FIG. 3), or coupled between the second asymmetric conducting component D2 and the input side 112 (not shown in the figure). The current-limiting circuit 160 is configured to adjust a current corresponding to the rectified alternating current $V_1$, and especially limit a maximum current corresponding to the rectified alternating current $V_1$. Therefore, the current-limiting circuit 160 can be used to protect the isolated input circuit 110, to prevent the input side 112 from being damaged for withstanding an excessive rectified alternating current $V_1$. In some embodiments, in addition to the above protection function, the current-limiting circuit 160 may also be used as one of determining components of the high and low voltage compensation device 100 operating in the high voltage mode or the low voltage mode. Through the resistor design in the current-limiting circuit 160, only the alternating current $V_{IN}$ at a high voltage is enough to drive the input side 112, so that the function of determining the high voltage mode and the low voltage mode is implemented. According to some embodiments, the current-limiting circuit 160 is a resistor.

In some embodiments, the driving circuit 120 includes a power supply circuit 122, a tank circuit 124, and a level signal generation circuit 126. The power supply circuit 122 is coupled to the actuation side 114. The tank circuit 124 is coupled to the power supply circuit 122 and the actuation side 114. The level signal generation circuit 126 is coupled between the tank circuit 124 and the isolated output circuit 140. Specifically, one end of the actuation side 114 is coupled to an earth terminal. The other end of the actuation side 114 is coupled to the power supply circuit 122, the tank circuit 124, and the level signal generation circuit 126. The power supply circuit 122 is coupled between the other end of the actuation side 114 and the first reference power $V_{DD1}$, and the tank circuit 124 is coupled between the other end of the actuation side 114 and the earth terminal. The driving circuit 120 is configured to generate a driving signal $V_3$. In the high voltage mode, when the actuation side 114 is conducted, the driving signal $V_3$ is a low level signal $V_{3L}$. In the low voltage mode, when the actuation side 114 is conducted, the driving signal $V_3$ is a high level signal $V_{3H}$.

In some embodiments, the power supply circuit 122 is configured to provide a first reference power $V_{DD1}$, and the tank circuit 124 is charged based on the first reference power $V_{DD1}$. In the high voltage mode, the actuation side 114 is conducted for a relatively long time, and an energy storage time of the tank circuit 124 is relatively short. Therefore, the voltage accumulated is a first actuation signal $V_{2L}$. In the low voltage mode, the actuation side 114 is conducted for a relatively short time, and the energy storage time of the tank circuit 124 is relatively long. Therefore, the voltage accumulated is a second actuation signal $V_{2H}$. Specifically, when the actuation side 114 is disconnected, the power supply circuit 122 and the tank circuit 124 may be regarded as voltage division circuits, and a voltage between the power supply circuit 122 and the tank circuit 124 is taken as a partial voltage of the first reference power $V_{DD1}$, so that the tank circuit 124 can be charged based on the first reference power $V_{DD1}$. Because the alternating current $V_{IN}$ of the high and low voltage compensation device 100 operating in the high voltage mode is higher than the alternating current $V_{IN}$ of the high and low voltage compensation device 100 operating in the low voltage mode, a time point at which the alternating current $V_{IN}$ in the high voltage mode causes the input side 112 to respond is earlier than a time point at which the alternating current $V_{IN}$ in the low voltage mode causes the input side 112 to respond. As far as a conduction time of the actuation side 114 is concerned, because the conduction time of the actuation side 114 in the high voltage mode is longer than that in the low voltage mode, the charging time of the tank circuit 124 in the high voltage mode is shorter than that in the low voltage mode. Therefore, as far as an actuation signal $V_2$ is concerned, the first actuation signal $V_{2L}$ outputted by the tank circuit 124 during discharging in the high voltage mode is lower than the second actuation signal $V_{2H}$ outputted by the tank circuit 124 during discharging in the low voltage mode. In some embodiments, the first actuation signal $V_{2L}$ is between 0.3 volts and 0.4 volts, and the second actuation signal $V_{2H}$ is between 3 volts and 4 volts. According to some embodiments, the power supply circuit 122 includes a resistor R3. The tank circuit 124 is an RC circuit, for example, a resistor R4 and a capacitor C1 are coupled in series.

In some embodiments, the level signal generation circuit 126 generates a driving signal $V_3$ according to the actuation signal $V_2$. Specifically, when in the low voltage mode, the level signal generation circuit 126 generates the high level signal $V_{3H}$ according to the second actuation signal $V_{2H}$. When in the high voltage mode, the level signal generation circuit 126 generates the low level signal $V_{3L}$ according to the first actuation signal $V_{2L}$. The level signal generation circuit 126 outputs a corresponding output signal according to whether a received input signal meets a specific threshold value (not shown in the figure). When the second actuation signal $V_{2H}$ meets the specific threshold value, the level signal generation circuit 126 outputs the high level signal $V_{3H}$, and when the first actuation signal $V_{2L}$ does not meet the specific threshold value, the level signal generation circuit 126 outputs the low level signal $V_{3L}$. In some embodiments, the specific threshold value is approximately 2 volts. According to some embodiments, the level signal generation circuit 126 is two NAND gate components coupled in series.

In some embodiments, the voltage between the power supply circuit 122 and the tank circuit 124 is a partial voltage of the first reference power $V_{DD1}$. When in the low voltage mode, the partial voltage of the first reference power $V_{DD1}$ meets the specific threshold value of the level signal generation circuit 126, so that the driving signal $V_3$ outputted by the level signal generation circuit 126 is the high level signal $V_{3H}$. When in the high voltage mode, the partial voltage of the first reference power $V_{DD1}$ does not meet the specific threshold value of the level signal generation circuit 126, so that the driving signal $V_3$ outputted by the level signal generation circuit 126 is the low level signal $V_{3L}$. Therefore, when the high and low voltage compensation device 100 operates in the low voltage mode, the level signal generation circuit 126 continuously outputs the high level signal $V_{3H}$. Conversely, when the high and low voltage compensation device 100 operates in the high voltage mode, the level signal generation circuit 126 continuously outputs the low level signal $V_{3L}$.

Figure 5:
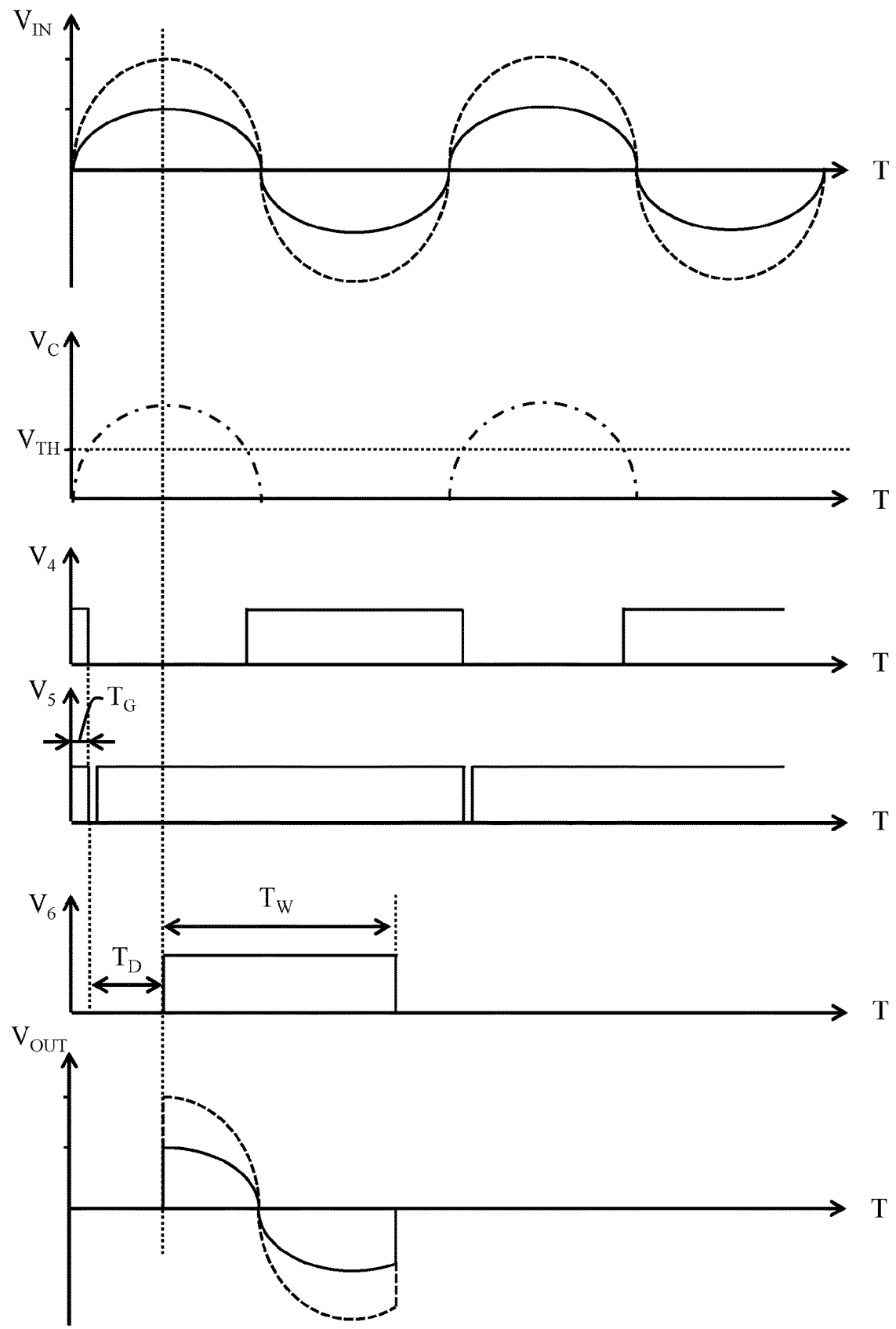
FIG. 5 is a signal diagram of a test power obtained after high and low voltage compensation according to FIG. 3.

FIG. 5 is a signal diagram of a test power obtained after high and low voltage compensation according to FIG. 3. Referring to FIG. 3 to FIG. 5, in some embodiments, the correcting circuit 130 is configured to correct the alternating current $V_{IN}$ to generate the compensation power $V_C$. One end of the correcting circuit 130 is coupled between the first asymmetric conducting component D1 and the input side 112. The other end of the correcting circuit 130 is coupled to the isolated output circuit 140. The correcting circuit 130 includes a first resistor R1 and a second resistor R2. When in the low voltage mode, the correcting circuit 130 generates the compensation power $V_C$ by using the first resistor R1. When in the high voltage mode, the correcting circuit 130 generates the compensation power $V_C$ by using the second resistor R2. Because the correcting circuit 130 cooperates with different compensation resistors according to a voltage of the alternating current $V_{IN}$, the correcting circuit 130 can output the compensation power $V_C$ with approximately the same rising slope or falling slope, even if the voltage of the alternating current $V_{IN}$ varies due to the operation in the high voltage mode or the low voltage mode. Therefore, whether the high and low voltage compensation device 100 operates in the high voltage mode or the low voltage mode, the compensation power $V_C$ outputted by the correcting circuit 130 is approximately the same.

In some embodiments, the isolated output circuit 140 includes an induction side 142, an output side 144, and a switch assembly 146. The output side 144 is a switch, and may be selectively coupled to the first resistor R1 or the second resistor R2. One end of the induction side 142 is coupled to a second reference power $V_{DD2}$, and the other end of the induction side 142 is coupled to the switch assembly 146. The switch assembly 146 is coupled between the other end of the induction side 142 and the earth terminal, and includes a control electrode E0. The control electrode E0 is coupled to the driving circuit 120. The isolated output circuit 140 is configured to selectively output the compensation power $V_C$ according to the driving signal $V_3$. Specifically, the control electrode E0 causes the switch assembly 146 to be on or off according to the driving signal $V_3$. When in the low voltage mode, the driving signal $V_3$ is the high level signal $V_{3H}$, and the switch assembly 146 is on. Conversely, when in the high voltage mode, the driving signal $V_3$ is the low level signal $V_{3L}$, and the switch assembly 146 is off. According to some embodiments, the switch assembly 146 is an NPN-type bipolar junction transistor (BJT) or an NMOS transistor.

Further, when the induction side 142 is responsive to the low level signal $V_{3L}$, the isolated output circuit 140 switches on the coupling between the output side 144 and the second resistor R2. When the induction side 142 is responsive to the high level signal $V_{3H}$, the isolated output circuit 140 switches on the coupling between the output side 144 and the first resistor R1. Therefore, whether in the high voltage mode or the low voltage mode, the high and low voltage compensation device 100 can output the compensation power $V_C$ through the two compensation ends P3, P4. In some embodiments, when the induction side 142 is not actuated, the output side 144 keeps being coupled to the second resistor R2. When the induction side 142 is actuated, the output side 144 is responsive to the induction side 142 and switches to be coupled to the first resistor R1. It needs to be specially noted that the foregoing description is only an example, and the present invention is not limited thereto. Designers may also use the following design as required: when the induction side 142 is not actuated, the output side 144 keeps being coupled to the first resistor R1, and when the induction side 142 is actuated, the output side 144 is responsive to the induction side 142 and switches to be coupled to the second resistor R2. According to some embodiments, a combination of the induction side 142 and the output side 144 is a relay.

Figure 6:
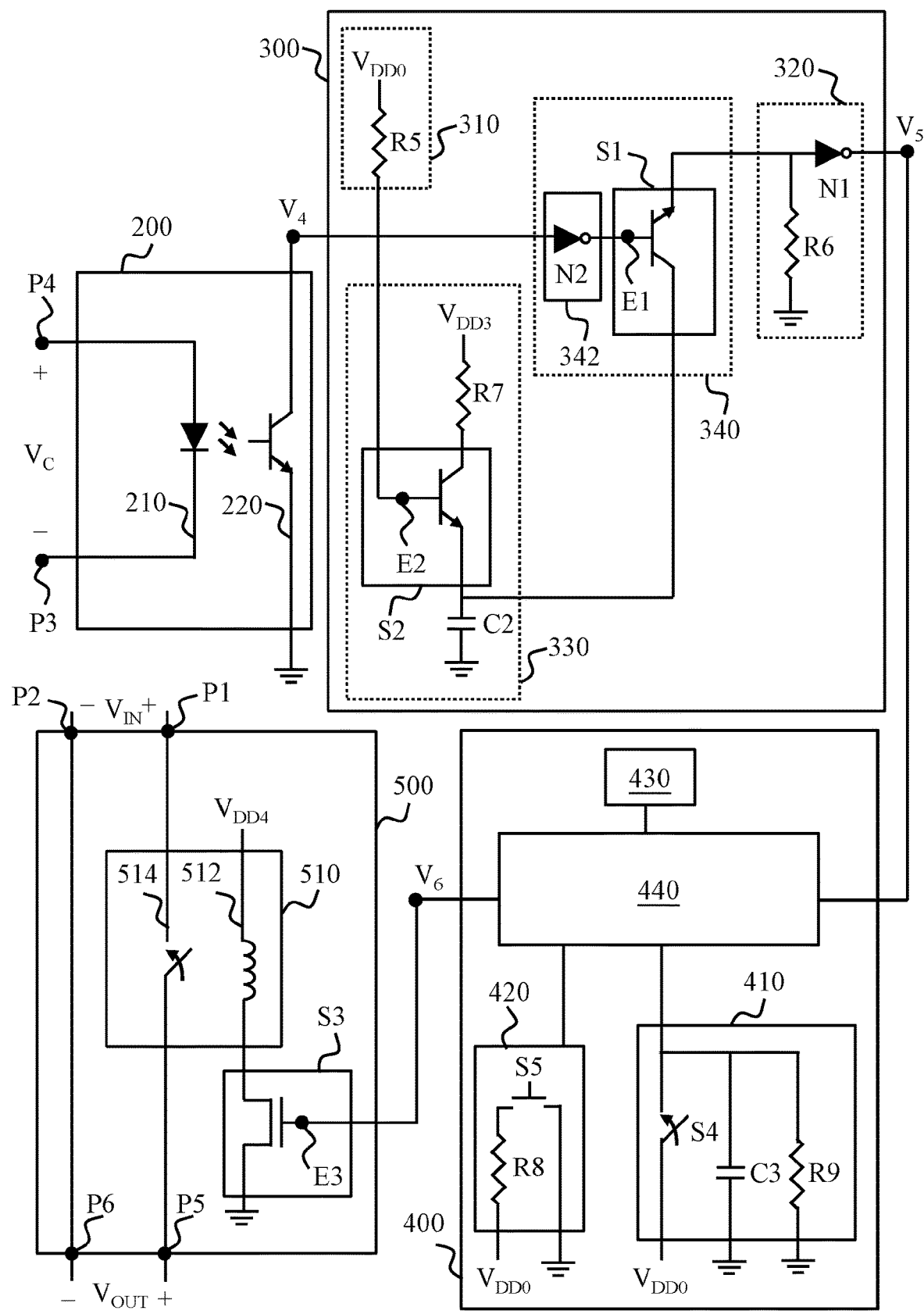
FIG. 6 is a partial circuit diagram of the inrush current test device according to FIG. 1.

FIG. 6 is a partial circuit diagram of the inrush current test device 10 according to FIG. 1. Referring to FIG. 1, FIG. 5, and FIG. 6, in some embodiments, the first isolation coupling component 200 includes a primary side 210 and a secondary side 220. The primary side 210 is coupled between the compensation ends P3, P4, one end of the secondary side 220 is coupled to the earth terminal, and the other end of the secondary side 220 is coupled to the positive crossing point pulse generation circuit 300. The primary side 210 is configured to be responsive to the compensation power $V_C$ and cause the secondary side 220 to be conducted or disconnected according to the compensation power $V_C$. In some embodiments, the primary side 210 causes the secondary side 220 to be conducted or disconnected according to whether the compensation power $V_C$ meets a threshold voltage $V_{TH}$. When the compensation power $V_C$ is greater than or equal to the threshold voltage $V_{TH}$, the primary side 210 is responsive to the compensation power $V_C$ to cause the secondary side 220 to be conducted. Conversely, when the compensation power $V_C$ is less than the threshold voltage $V_{TH}$, the first isolation coupling component 200 disconnects the secondary side 220. In some embodiments, the threshold voltage $V_{TH}$ is greater than zero. According to some embodiments, the first isolation coupling component 200 is, for example but not limited to, an isolated coupling component or an optical coupling component.

Figure 7:
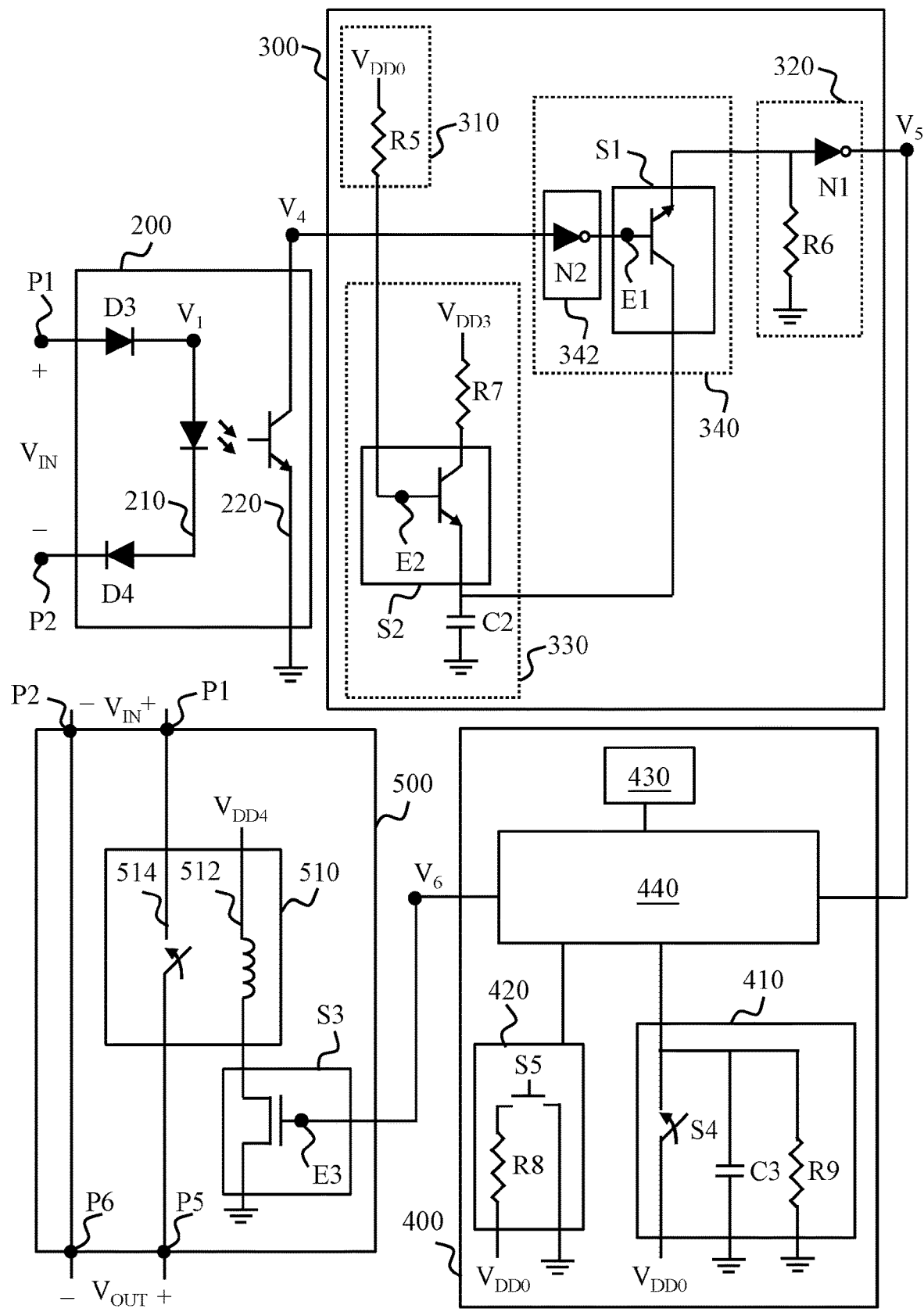
FIG. 7 is a circuit diagram of the inrush current test device according to FIG. 2.
Figure 8:
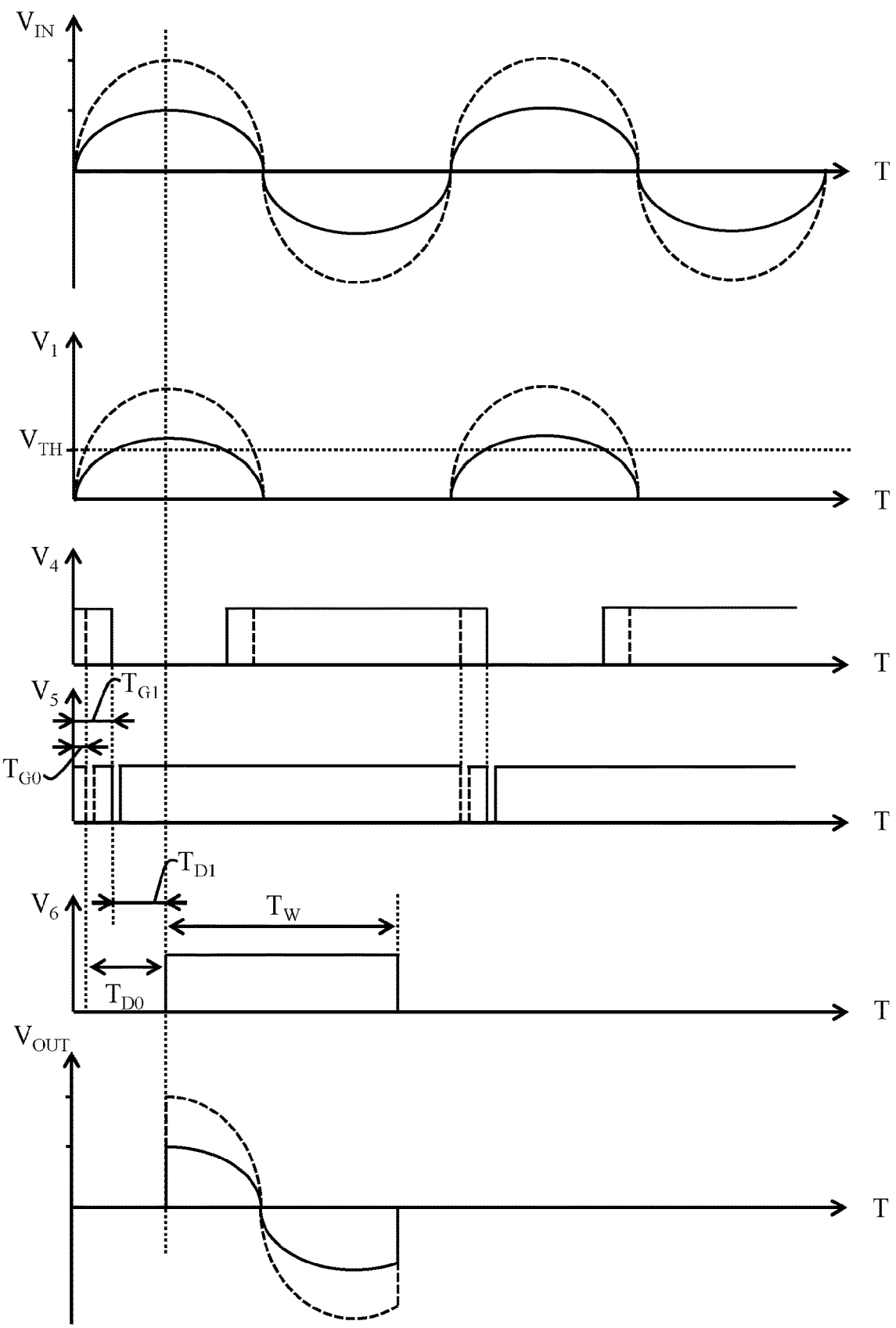
FIG. 8 is a signal diagram of a test power without high and low voltage compensation according to FIG. 7.

FIG. 7 is a circuit diagram of the inrush current test device 10' according to FIG. 2, and FIG. 8 is a signal diagram of a test power without high and low voltage compensation according to FIG. 7. Referring to FIG. 2, FIG. 7, and FIG. 8, in some embodiments, the inrush current test device 10' includes a first isolation coupling component 200, a positive crossing point pulse generation circuit 300, a control circuit 400, an output circuit 500, input ends P1, P2, and output ends P5, P6. The first isolation coupling component 200 is coupled to the positive crossing point pulse generation circuit 300, the positive crossing point pulse generation circuit 300 is coupled to the control circuit 400, and the control circuit 400 is coupled to the output circuit 500. The first isolation coupling component 200 includes a third asymmetric conducting component D3, a fourth asymmetric conducting component D4, a primary side 210, and a secondary side 220. The third asymmetric conducting component D3 is coupled between the input end P1 and the primary side 210. The fourth asymmetric conducting component D4 is coupled between the input end P2 and the primary side 210. The first isolation coupling component 200 receives the alternating current $V_{IN}$ from the input ends P1, P2. The third asymmetric conducting component D3 and the fourth asymmetric conducting component D4 are configured to rectify the alternating current $V_{IN}$ into a rectified alternating current $V_1$. The primary side 210 and the secondary side 220 of the first isolation coupling component 200, the positive crossing point pulse generation circuit 300, and the control circuit 400 actuate the output circuit 500 according to the rectified alternating current $V_1$. The output circuit 500 receives the alternating current $V_{IN}$ from the input ends P1, P2, and when the output circuit 500 is actuated, the test power $V_{OUT}$ is outputted through the output ends P5, P6. According to some embodiments, the third asymmetric conducting component D3 and the fourth asymmetric conducting component D4 are diodes.

In some embodiments, the primary side 210 is coupled between the input ends P1, P2 through the third asymmetric conducting component D3 and the fourth asymmetric conducting component D4. One end of the secondary side 220 is coupled to the earth terminal, and the other end of the secondary side 220 is coupled to the positive crossing point pulse generation circuit 300. In some embodiments, the primary side 210 causes the secondary side 220 to be conducted or disconnected according to whether the rectified alternating current $V_1$ meets a threshold voltage $V_{TH}$. When the rectified alternating current $V_1$ is greater than or equal to the threshold voltage $V_{TH}$, the primary side 210 is responsive to the rectified alternating current $V_1$ to cause the secondary side 220 to be conducted. Conversely, when the rectified alternating current $V_1$ is less than the threshold voltage $V_{TH}$, the first isolation coupling component 200 disconnects the secondary side 220.

Refer to FIG. 6 and FIG. 7. In some embodiments, the positive crossing point pulse generation circuit 300 generates a positive crossing point pulse $V_5$ when the secondary side 220 transits from an off state to an on state. The positive crossing point pulse generation circuit 300 includes a level generation circuit 310, an inverter circuit 320, a charge and discharge circuit 330, and a switch circuit 340. The level generation circuit 310 is coupled to the secondary side 220. The inverter circuit 320 is coupled to the control circuit 400. The charge and discharge circuit 330 is coupled to the level generation circuit 310. The switch circuit 340 is coupled to the level generation circuit 310, the charge and discharge circuit 330, and the inverter circuit 320. According to some embodiments, a time difference between a time point of a positive crossing point of the alternating current $V_{IN}$ and a time point at which the positive crossing point pulse generation circuit 300 generates the positive crossing point pulse $V_5$ is a pulse generation time $T_G$, that is, a time difference between a time point at which the positive crossing point pulse generation circuit 300 is responsive to the positive crossing point of the alternating current $V_{IN}$ and a time point at which the positive crossing point pulse generation circuit 300 generates the positive crossing point pulse $V_5$.

Refer to FIG. 5 and FIG. 8. It needs to be specially noted that, in some embodiments, because the inrush current test device 10' does not include the high and low voltage compensation device 100 configured to correct the alternating current $V_{IN}$, the delay time $T_G$ in the high voltage mode is different from that in the low voltage mode. Because a voltage increase of the alternating current $V_{IN}$ per unit time in the high voltage mode is greater than that in the low voltage mode, the positive crossing point pulse $V_5$ is generated earlier in the high voltage mode than in the low voltage mode, that is, a high voltage pulse generation time $T_{G0}$ is shorter than a low voltage pulse generation time $T_{G1}$.

Continue to refer to FIG. 6 and FIG. 7. In some embodiments, the level generation circuit 310 is coupled between a reference supply $V_{DD0}$ and the other end of the secondary side 220. The level generation circuit 310 is configured to generate a low level when the secondary side 220 is conducted, and provide a high level when the secondary side 220 is disconnected. The low level and the high level constitute a level signal $V_4$. Specifically, when the secondary side 220 is conducted, one end of the secondary side 220 and the other end of the secondary side 220 are regarded as being short-circuited, and therefore a potential of the other end of the secondary side 220 is similar to an earth terminal, that is, the low level. When the secondary side 220 is disconnected, the level generation circuit 310 and the charge and discharge circuit 330 may be regarded as voltage division circuits, and therefore the potential of the other end of the secondary side 220 is a partial voltage of the reference supply $V_{DD0}$, that is, the high level. According to some embodiments, the level generation circuit 310 includes a resistor R5.

In some embodiments, the inverter circuit 320 includes a first inverter N1 and a resistor R6. The resistor R6 is coupled between the earth terminal and the first inverter N1. The first inverter N1 outputs a low potential signal when a potential of the resistor R6 is higher than a first threshold, and outputs a high potential signal when the potential of the resistor R6 is not higher than the first threshold. The low potential signal and the high potential signal constitute a positive crossing point pulse $V_5$. When the level generation circuit 310 generates the high level, the charge and discharge circuit 330 is configured to charge the resistor R6. When the level generation circuit 310 generates the low level, the charge and discharge circuit 330 is configured to discharge electricity to the resistor R6, to generate the potential of the resistor R6. The switch circuit 340 is configured to cut off the coupling between the charge and discharge circuit 330 and the resistor R6 when the level generation circuit 310 generates the high level. Specifically, when the level generation circuit 310 generates the low level, the switch circuit 340 is on, that is, the charge and discharge circuit 330 is conducted to the resistor R6. Therefore, the charge and discharge circuit 330 discharges electricity to the resistor R6, that is, a current passes through the resistor R6, causing the potential of the resistor R6 to be higher than the first threshold. Therefore, the inverter circuit 320 outputs the low potential signal. When the level generation circuit 310 generates the high level, the switch circuit 340 is off, that is, the charge and discharge circuit 330 is disconnected from the resistor R6. Because no current passes through the resistor R6, potentials at both ends of the resistor R6 are almost equal. Therefore, the potential of the resistor R6 is similar to the earth terminal, that is, the potential of the resistor R6 is not higher than the first threshold. Therefore, the inverter circuit 320 outputs the high potential signal.

In some embodiments, the switch circuit 340 includes a first switch S1 and a delay circuit 342. The first switch S1 includes a first control end E1. The first switch S1 is coupled between the charge and discharge circuit 330 and the inverter circuit 320. To be more specific, one end of the first switch S1 is coupled between the first inverter N1 of the inverter circuit 320 and the resistor R6. The delay circuit 342 is coupled between the level generation circuit 310 and the first control end E1. The first switch S1 is configured to cut off the coupling between the charge and discharge circuit 330 and the resistor R6 when the level signal $V_4$ is at the high level. The first switch S1 is configured to switch on the coupling between the charge and discharge circuit 330 and the resistor R6 when the level signal $V_4$ is at the low level. The delay circuit 342 is configured to delay a first response time. It needs to be specially noted that the first response time is the time in which the level signal $V_4$ controls the first switch S1. According to some embodiments, the delay circuit 342 is a second inverter N2. The first switch S1 is an NPN-type bipolar junction transistor (BJT) or an NMOS transistor. Therefore, when the level signal $V_4$ is at the low level, the first control end E1 receives a signal of the high level, so that the first switch S1 is on. Conversely, when the level signal $V_4$ is at the high level, the first control end E1 receives a signal of the low level, so that the first switch S1 is off.

In some embodiments, the charge and discharge circuit 330 includes a resistor R7, a second switch S2, and a capacitor C2 that are coupled in series in sequence. The second switch S2 includes a second control end 2. The resistor R7 is coupled between a direct-current power supply $V_{DD3}$ and the second switch S2. The second switch S2 is coupled between the resistor R7 and the capacitor C2. The capacitor C2 is coupled between the second switch S2 and the earth terminal. The second control end 2 is coupled to the level generation circuit 310. The capacitor C2 is adapted to operate in a charge state and a discharge state. The second switch S2 is configured to switch on the coupling between the capacitor C2 and the resistor R7 when the level signal $V_4$ is at the high level, to cause the capacitor C2 to operate in the charge state. The second switch S2 is configured to cut off the coupling between the capacitor C2 and the resistor R7 when the level signal $V_4$ is at the low level. Moreover, the capacitor C2 is caused to operate in the discharge state because the first switch S1 is on. Specifically, when the second switch S2 is on, the direct-current power supply $V_{DD3}$ charges an RC circuit including the resistor R7 and the capacitor C2. Conversely, when the second switch S2 is off, because the first switch S1 is on, the capacitor C2 discharges electricity to the resistor R6 to generate the potential of the resistor R6.

In some embodiments, the control circuit 400 includes a phase determining circuit 410, an actuating circuit 420, a response correction circuit 430, and a main control unit 440. The main control unit 440 is respectively coupled to the phase determining circuit 410, the actuating circuit 420, the response correction circuit 430, the positive crossing point pulse generation circuit 300, and the output circuit 500. When the control circuit 400 (that is, the main control unit 440) is actuated and the positive crossing point pulse $V_5$ is detected, after delaying for a delay time $T_D$, the control circuit 400 outputs a control pulse $V_6$. The control pulse $V_6$ is configured to actuate the output circuit 500 and keep the output circuit 500 actuated during a first operating time $T_W$. According to some embodiments, the main control unit 440 is, for example but not limited to, a microprocessor, a single chip microcontroller unit (MCU), or a system on chip (SoC), and the main control unit 440 may include a circuit corresponding to the microprocessor, the single chip microcontroller unit, or the system on chip.

In some embodiments, the phase determining circuit 410 includes a fourth switch S4, and the fourth switch S4 is coupled between the reference supply $V_{DD0}$ and the main control unit 440. The phase determining circuit 410 is configured to provide a reference phase to the control circuit 400 (that is, the main control unit 440). As described above, the reference phase is, for example but not limited to, 90 degrees, 270 degrees, or other phases. It needs to be specially noted that the control circuit 400 adjusts the delay time $T_D$ according to the reference phase. According to some embodiments, when the fourth switch S4 is on, the reference phase is a first phase (such as 270 degrees). When the fourth switch S4 is off, the reference phase is a second phase (such as 90 degrees).

In some embodiments, the phase determining circuit 410 further includes a set of parallel RC circuits (a capacitor C3 and a resistor R9), one end of the RC circuit is coupled between the main control unit 440 and one end of the fourth switch S4, and the other end of the RC circuit is coupled to the earth terminal. The other end of the fourth switch S4 is coupled to the reference supply $V_{DD0}$. The RC circuit has a function of eliminating the voltage bounce phenomenon when a mechanical switch is actuated, so that a control signal increases and decreases smoothly. Therefore, when the fourth switch S4 is on, the phase determining circuit 410 inputs the reference supply $V_{DD0}$ to charge C, causing a voltage of the main control unit 440 to gradually increase. Conversely, when the fourth switch S4 is off, C discharges electricity to the ground through R, causing the voltage of the main control unit 440 to gradually decrease.

In some embodiments, the actuating circuit 420 includes a fifth switch S5 and a resistor R8, where the fifth switch S5 and the resistor R8 are coupled between the reference supply $V_{DD0}$ and the earth terminal in series. The resistor R8 acts as a current-limiting resistor of the actuating circuit 420 to avoid short circuit between the reference supply $V_{DD0}$ and the earth terminal. When the fifth switch S5 is triggered, the actuating circuit 420 outputs an actuating pulse. The actuating pulse is used for actuating the control circuit 400 (that is, the main control unit 440) and keeping the control circuit 400 actuated during a second operating time. According to some embodiments, the fifth switch S5 is a stepless switch. When the fifth switch S5 is pressed, the fifth switch S5 is triggered.

Continue to refer to FIG. 5 and FIG. 8. In some embodiments, the response correction circuit 430 is configured to provide the second response time to the control circuit 400 (that is, the main control unit 440), and the control circuit adjusts the delay time $T_D$ according to the second response time. It needs to be specially noted that, because the inrush current test device 10' does not include the high and low voltage compensation device 100, the delay time $T_D$ in the high voltage mode is different from that in the low voltage mode. Because the response correction circuit 430 correspondingly compensates the delay time $T_D$ according to different pulse generation times $T_G$, the delay time $T_D$ of the response correction circuit 430 in the high voltage mode is a high voltage delay time $T_{D0}$, the delay time $T_D$ of the response correction circuit 430 in the low voltage mode is a low voltage delay time $T_{D1}$, and the high voltage pulse generation time $T_{G0}$ is shorter than the low voltage pulse generation time $T_{G1}$. Therefore, the high voltage delay time $T_{D0}$ is longer than the low voltage delay time $T_{D1}$. In some embodiments, duration of the low voltage pulse generation time $T_{G1}$ minus the high voltage pulse generation time $T_{G0}$ is equal to duration of the high voltage delay time $T_{D0}$ minus the low voltage delay time $T_{D1}$. According to some embodiments, the response correction circuit 430 includes a variable resistor, and the variable resistor is coupled between the reference supply (not shown in the figure) and the earth terminal. The variable resistor is configured to divide a voltage of the reference supply and generate a partial voltage signal, and the partial voltage signal corresponds to the second response time.

Continue to refer to FIG. 6 and FIG. 7. In some embodiments, the output circuit 500 includes a second isolation coupling component 510 and a third switch S3. The second isolation coupling component 510 includes a receiving side 512 and a response side 514. The response side 514 is a switch. One end of the receiving side 512 is coupled to a DC power $V_{DD4}$, and the other end of the receiving side 512 is coupled to the third switch S3. The third switch S3 is coupled between the other end of the receiving side 512 and the earth terminal. The third switch S3 includes a third control end E3, and the third control end E3 is coupled to the control circuit 400. It needs to be specially noted that the third switch S3 is on according to the control pulse $V_6$, and the conducted third switch S3 actuates the receiving side 512. Therefore, when the receiving side 512 is actuated, the second isolation coupling component 510 is responsive to the control pulse $V_6$ on the receiving side 512, and conducts the response side 514 to output a test power $V_{OUT}$. According to some embodiments, the second isolation coupling component 510 is a relay.

In some embodiments, the output circuit 500 is configured to receive the alternating current $V_{IN}$. When the output circuit 500 is actuated by the control pulse $V_6$ outputted by the control circuit 400, the output circuit 500 outputs the test power $V_{OUT}$. As the function of the inrush current test device 10 (10') described above, the output circuit 500 is configured to output the received alternating current $V_{IN}$ in the form of the test power $V_{OUT}$, and the outputted test power $V_{OUT}$ is the alternating current $V_{IN}$ in the reference phase. It needs to be specially noted that the output circuit 500 continuously outputs the test power $V_{OUT}$ during a first operating time $T_W$ according to the control pulse $V_6$. Therefore, when the operating time $T_W$ is extremely short, the test power $V_{OUT}$ used for testing the inrush current may be regarded as a pulse signal.

Figure 9:
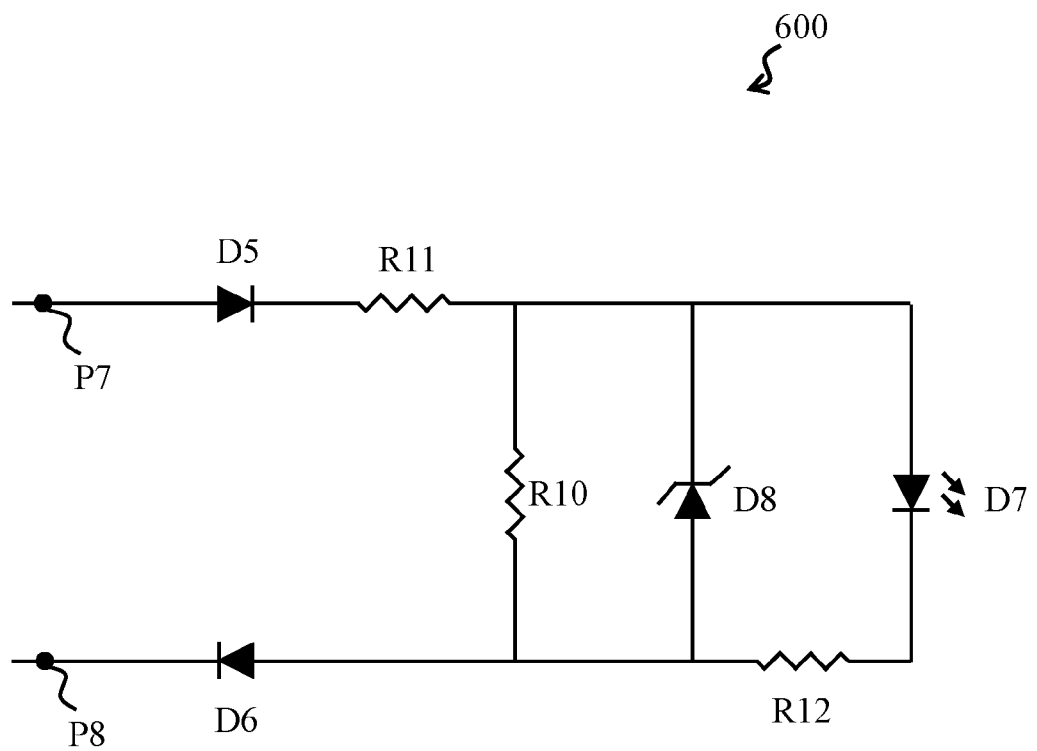
FIG. 9 is a circuit diagram of a wire detection circuit according to some embodiments of the present invention.

FIG. 9 is a circuit diagram of a wire detection circuit 600 according to some embodiments of the present invention. Referring to FIG. 9, in some embodiments, the inrush current test device 10 (10') further includes a wire detection circuit 600. The wire detection circuit 600 includes a fifth asymmetric conducting component D5, a sixth asymmetric conducting component D6, an indicator component D7, a voltage regulating component D8, resistors R10, R11, R12, and detection sides P7, P8. The fifth asymmetric conducting component D5 is coupled between the detection side P7 and the resistor R11. The sixth asymmetric conducting component D6 is coupled between the detection side P8 and the resistor R10. The resistor R11 is coupled to the resistor R10 in series. The voltage regulating component D8 is coupled to the resistor R10 in parallel. The indicator component D7 is coupled to the resistor R12 in series. The indicator component D7 and the resistor R12 in series are further coupled to the resistor R10 in parallel. In other words, one end of the resistor R10 is coupled to the resistor R11, one side of the voltage regulating component D8, and the indicator component D7; the other end of the resistor R10 is coupled to the sixth asymmetric conducting component D6, the other side of the voltage regulating component D8, and the resistor R12. The alternating current $V_{IN}$ includes a live wire end, a zero line end, and a ground wire end. The wire detection circuit 600 outputs an auxiliary signal by using the indicator component D7 to distinguish between the live wire end and the zero line end of the alternating current $V_{IN}$. The detection side P8 is coupled to the ground wire end, and the detection side P7 is coupled to the input end P1. When the alternating current $V_{IN}$ received by the detection side P7 is the live wire end, the auxiliary signal is a first indication signal. Conversely, when the alternating current $V_{IN}$ received by the detection side P7 is the zero line end, the auxiliary signal is a second indication signal. The fifth asymmetric conducting component D5 and the sixth asymmetric conducting component D6 are configured to limit the direction of the current flowing into the wire detection circuit 600. The resistor R11 is configured to limit a maximum input current value. The resistor R10 and the resistor R11 form a voltage division circuit, and resistance values of the resistor R10 and the resistor R11 are designed to adjust a cross voltage of the resistor R10. The resistor R12 is configured to limit a maximum current of the indicator component D7, to prevent the indicator component D7 from being damaged by over-current. The voltage regulating component D8 is configured to provide a stable voltage to the indicator component D7, thereby preventing the indicator component D7 from being damaged due to an excessive voltage. According to some embodiments, the indicator component D7 is, for example but not limited to, a light emitting diode. The indicator component D7 emitting light is taken as a first indication signal; the indicator component D7 not emitting light is taken as a second indication signal. In addition, the voltage regulating component D8 is, for example but not limited to, a Zener diode.

In conclusion, the inrush current test device in some embodiments of the present invention is adapted to receive an alternating current, generate a positive crossing point pulse according to a positive crossing point of the alternating current, and output a test power according to the positive crossing point pulse, where the test power is an alternating current in a reference phase. Therefore, the inrush current test device can provide an inrush current in an accurate phase to an electronic device for testing. According to some embodiments, the high and low voltage compensation device corrects the alternating current by operating in a high voltage mode and a low voltage mode, and outputs a compensation power with the same voltage rising slope by using the corrected alternating current. Therefore, the high and low voltage compensation device can ensure that the inrush current test device in the present invention uses the compensation power with the same voltage rising slope for phase calculation, whether the input alternating current is in the high voltage mode or the low voltage mode, so as to reduce the phase error.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:
1. An inrush current test device, adapted to receive an alternating current, comprising:
   a first isolation coupling component, comprising a primary side and a secondary side, wherein the first isolation coupling component is responsive to a positive half-cycle potential of the alternating current on the primary side and conducts the secondary side;
   a positive crossing point pulse generation circuit, coupled to the first isolation coupling component and configured to generate a positive crossing point pulse when the secondary side transits from an off state to an on state;
   an output circuit, configured to receive the alternating current and output the alternating current when the output circuit is actuated; and
   a control circuit, coupled to the positive crossing point pulse generation circuit and the output circuit, wherein when the control circuit is actuated and the positive crossing point pulse is detected, after delaying for a delay time, the control circuit outputs a control pulse for actuating the output circuit for a first operating time.

2. The inrush current test device according to claim 1, further comprising: a wire detection circuit, configured to output an auxiliary signal, the alternating current comprising a live wire end, a zero line end, and a ground wire end, wherein one end of the wire detection circuit is coupled to the ground wire end, the auxiliary signal is a first indication signal when the other end of the wire detection circuit is coupled to the live wire end, and the auxiliary signal is a second indication signal when the other end of the wire detection circuit is coupled to the zero line end.

3. The inrush current test device according to claim 1, wherein the positive crossing point pulse generation circuit comprises:
   a level generation circuit, coupled to the secondary side and configured to generate a low level when the secondary side is conducted and provide a high level when the secondary side is disconnected, the low level and the high level constituting a level signal;
   an inverter circuit, coupled to the control circuit and comprising a first inverter and a resistor, wherein the first inverter outputs a low potential signal when a potential of the resistor is higher than a first threshold, and outputs a high potential signal when the potential of the resistor is not higher than the first threshold, the low potential signal and the high potential signal constituting the positive crossing point pulse;
   a charge and discharge circuit, coupled to the level generation circuit and configured to charge the resistor when the level generation circuit generates the high level and discharge to the resistor when the level generation circuit generates the low level, so as to generate the potential of the resistor; and
   a switch circuit, coupled to the level generation circuit, the charge and discharge circuit, and the inverter circuit, and configured to cut off the coupling between the charge and discharge circuit and the resistor when the level generation circuit generates the high level.

4. The inrush current test device according to claim 3, further comprising: a wire detection circuit, configured to output an auxiliary signal, the alternating current comprising a live wire end, a zero line end, and a ground wire end, wherein one end of the wire detection circuit is coupled to the ground wire end, the auxiliary signal is a first indication signal when the other end of the wire detection circuit is coupled to the live wire end, and the auxiliary signal is a second indication signal when the other end of the wire detection circuit is coupled to the zero line end.

5. The inrush current test device according to claim 3, wherein the switch circuit comprises:
   a first switch, coupled between the charge and discharge circuit and the inverter circuit and comprising a first control end, wherein the first switch is configured to cut off the coupling between the charge and discharge circuit and the resistor when the level signal is at the high level and switch on the coupling between the charge and discharge circuit and the resistor when the level signal is at the low level; and
   a delay circuit, coupled between the level generation circuit and the first control end, wherein the delay circuit is configured to delay a first response time, the first response time being a time which the level signal controls the first switch.

6. The inrush current test device according to claim 5, further comprising: a wire detection circuit, configured to output an auxiliary signal, the alternating current comprising a live wire end, a zero line end, and a ground wire end, wherein one end of the wire detection circuit is coupled to the ground wire end, the auxiliary signal is a first indication signal when the other end of the wire detection circuit is coupled to the live wire end, and the auxiliary signal is a second indication signal when the other end of the wire detection circuit is coupled to the zero line end.

7. The inrush current test device according to claim 5, wherein the delay circuit is a second inverter.

8. The inrush current test device according to claim 7, further comprising: a wire detection circuit, configured to output an auxiliary signal, the alternating current comprising a live wire end, a zero line end, and a ground wire end, wherein one end of the wire detection circuit is coupled to the ground wire end, the auxiliary signal is a first indication signal when the other end of the wire detection circuit is coupled to the live wire end, and the auxiliary signal is a second indication signal when the other end of the wire detection circuit is coupled to the zero line end.

9. The inrush current test device according to claim 3, wherein the charge and discharge circuit comprises:
   another resistor, coupled to a direct-current power supply;
   a capacitor, adapted to operate in a charge state and a discharge state; and
   a second switch, coupled between the another resistor and the capacitor and comprising a second control end, wherein the second control end is coupled to the level generation circuit, and the second switch is configured to switch on the coupling between the capacitor and the another resistor when the level signal is at the high level to cause the capacitor to operate in the charge state, and cut off the coupling between the capacitor and the another resistor when the level signal is at the low level to cause the capacitor to operate in the discharge state.

10. The inrush current test device according to claim 9, further comprising: a wire detection circuit, configured to output an auxiliary signal, the alternating current comprising a live wire end, a zero line end, and a ground wire end, wherein one end of the wire detection circuit is coupled to the ground wire end, the auxiliary signal is a first indication signal when the other end of the wire detection circuit is coupled to the live wire end, and the auxiliary signal is a second indication signal when the other end of the wire detection circuit is coupled to the zero line end.

11. The inrush current test device according to claim 1, wherein the control circuit comprises: a phase determining circuit, configured to provide a reference phase to the control circuit, the control circuit adjusts the delay time according to the reference phase, the phase determining circuit comprises a fourth switch, and the reference phase is a first phase when the fourth switch is on and the reference phase is a second phase when the fourth switch is off.

12. The inrush current test device according to claim 11, further comprising: a wire detection circuit, configured to output an auxiliary signal, the alternating current comprising a live wire end, a zero line end, and a ground wire end, wherein one end of the wire detection circuit is coupled to the ground wire end, the auxiliary signal is a first indication signal when the other end of the wire detection circuit is coupled to the live wire end, and the auxiliary signal is a second indication signal when the other end of the wire detection circuit is coupled to the zero line end.

13. The inrush current test device according to claim 1, wherein the control circuit comprises an actuating circuit, the actuating circuit comprises a fifth switch, the actuating circuit outputs an actuating pulse when the fifth switch is triggered, and the actuating pulse actuates the control circuit for a second operating time.

14. The inrush current test device according to claim 13, further comprising: a wire detection circuit, configured to output an auxiliary signal, the alternating current comprising a live wire end, a zero line end, and a ground wire end, wherein one end of the wire detection circuit is coupled to the ground wire end, the auxiliary signal is a first indication signal when the other end of the wire detection circuit is coupled to the live wire end, and the auxiliary signal is a second indication signal when the other end of the wire detection circuit is coupled to the zero line end.

15. The inrush current test device according to claim 1, wherein the control circuit comprises: a response correction circuit, configured to provide a second response time to the control circuit, and the control circuit adjusts the delay time according to the second response time.

16. The inrush current test device according to claim 15, further comprising: a wire detection circuit, configured to output an auxiliary signal, the alternating current comprising a live wire end, a zero line end, and a ground wire end, wherein one end of the wire detection circuit is coupled to the ground wire end, the auxiliary signal is a first indication signal when the other end of the wire detection circuit is coupled to the live wire end, and the auxiliary signal is a second indication signal when the other end of the wire detection circuit is coupled to the zero line end.

17. The inrush current test device according to claim 1, wherein the output circuit comprises: a second isolation coupling component, coupled to the control circuit and comprising a receiving side and a response side, and the second isolation coupling component is responsive to the control pulse on the receiving side and conducts the response side to output the alternating current.

18. The inrush current test device according to claim 17, further comprising: a wire detection circuit, configured to output an auxiliary signal, the alternating current comprising a live wire end, a zero line end, and a ground wire end, wherein one end of the wire detection circuit is coupled to the ground wire end, the auxiliary signal is a first indication signal when the other end of the wire detection circuit is coupled to the live wire end, and the auxiliary signal is a second indication signal when the other end of the wire detection circuit is coupled to the zero line end.

* * * * *